(12) United States Patent
Momota et al.

(10) Patent No.: US 11,764,571 B2
(45) Date of Patent: Sep. 19, 2023

(54) ESD PLACEMENT IN SEMICONDUCTOR DEVICE

(71) Applicant: MICRON TECHNOLOGY, INC., Boise, ID (US)

(72) Inventors: Haruka Momota, Sagamihara (JP); Takashi Ishihara, Machida (JP)

(73) Assignee: Micron Technology, Inc., Boise, ID (US)

(*) Notice: Subject to any disclaimer, the term of this patent is extended or adjusted under 35 U.S.C. 154(b) by 448 days.

(21) Appl. No.: 17/071,562

(22) Filed: Oct. 15, 2020

(65) Prior Publication Data
US 2022/0123550 A1    Apr. 21, 2022

(51) Int. Cl.
*H02H 9/04* (2006.01)
*H01L 27/02* (2006.01)

(52) U.S. Cl.
CPC ......... *H02H 9/046* (2013.01); *H01L 27/0248* (2013.01); *H01L 27/0296* (2013.01)

(58) Field of Classification Search
CPC .................. H02H 9/046; H01L 27/0248–0296
See application file for complete search history.

(56) References Cited

U.S. PATENT DOCUMENTS

| | | | |
|---|---|---|---|
| 2013/0191581 A1* | 7/2013 | Chen | G06F 13/16 711/103 |
| 2018/0204831 A1* | 7/2018 | Seidemann | H01L 23/481 |
| 2021/0375742 A1* | 12/2021 | Li | H01L 24/80 |

* cited by examiner

*Primary Examiner* — Jared Fureman
*Assistant Examiner* — Christopher J Clark
(74) *Attorney, Agent, or Firm* — Dorsey & Whitney LLP

(57) ABSTRACT

Disclosed herein is an apparatus that includes a first power ESD protection circuit arranged in a first circuit area; a plurality of data I/O circuits arranged in a second circuit area adjacent to the first circuit area in a first direction; a plurality of data I/O terminals arranged in the second circuit area, each of the plurality of data I/O terminals being coupled to an associated one of the plurality of data I/O circuits; a plurality of first power terminals arranged in the second circuit area; and a first power line extending in the first direction, the first power line coupling the plurality of first power terminals to the first power ESD protection circuit.

20 Claims, 9 Drawing Sheets

US 11,764,571 B2

ESD PLACEMENT IN SEMICONDUCTOR DEVICE

BACKGROUND

Semiconductor devices such as a DRAM have a plurality of data I/O terminals. Particularly, a wide I/O DRAM has many data I/O terminals, and therefore it is not easy to arrange an associated data I/O circuit in vicinity of each of the data I/O terminals and to set the distances between the data I/O terminals and the associated data I/O circuits to be same.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structural, logical and electrical changes may be made without departing from the scope of the present invention. The various embodiments disclosed herein are not necessary mutually exclusive, as some disclosed embodiments can be combined with one or more other disclosed embodiments to form new embodiments.

Figure 1:
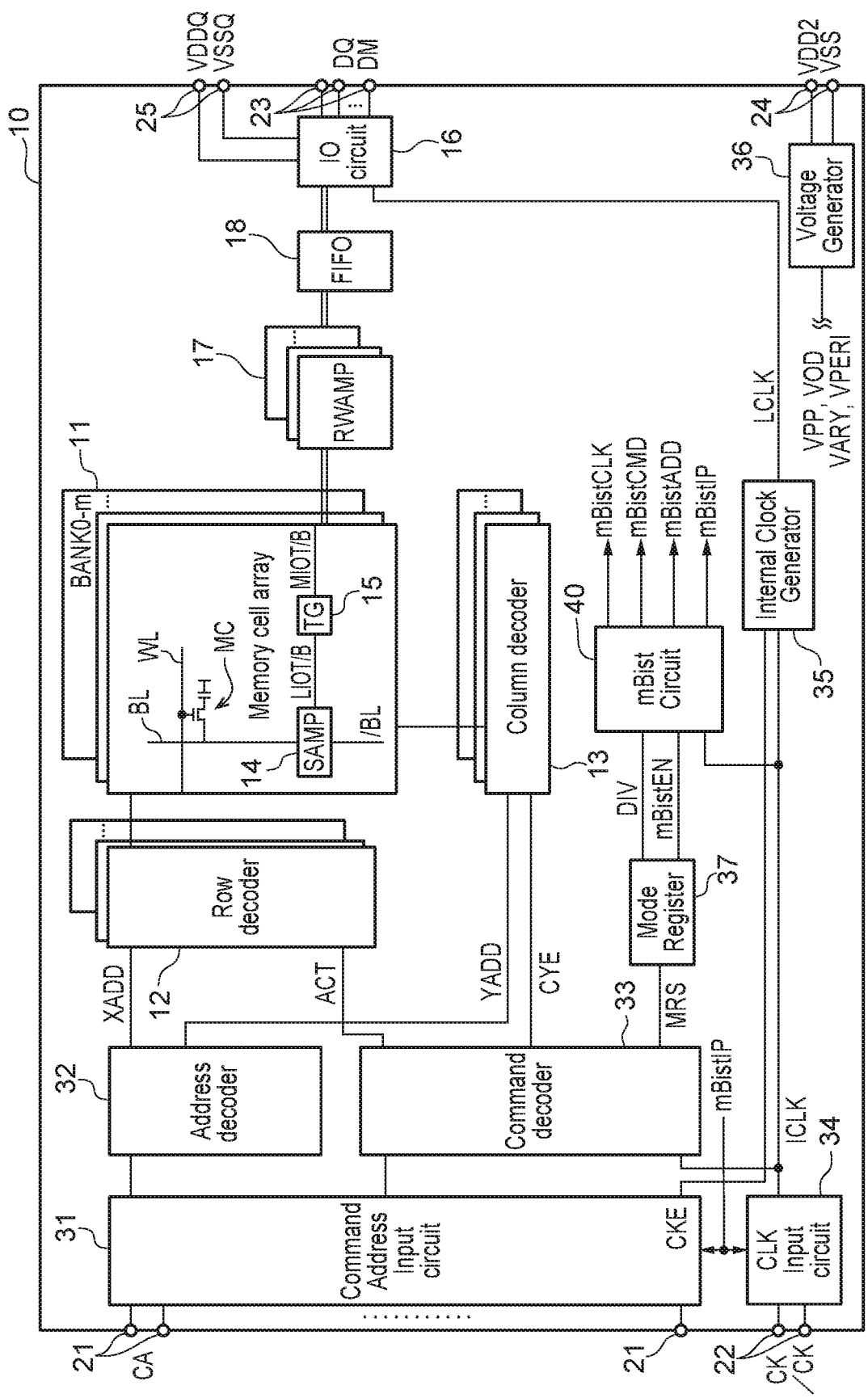
FIG. 1 is a block diagram of a semiconductor device 10 according to an embodiment of the present disclosure.

FIG. 1 is a block diagram of a semiconductor device 10 according to one embodiment of the present disclosure. The semiconductor device 10 can be, for example, a wide I/O DRAM incorporated into a single semiconductor chip. As shown in FIG. 1, the semiconductor device 10 includes a memory cell array 11. The memory cell array 11 includes a plurality of word lines WL, a plurality of bit lines BL, and a plurality of memory cells MC respectively provided at intersections between the word lines WL and the bit lines BL. Selection of the word lines WL is performed by a row decoder 12 and selection of the hit lines BL is performed by a column decoder 13. A sense amplifier 14 is coupled to a corresponding one of the hit lines BL and a local I/O line pair LIOT/B. The local I/O line pair LIOT/B is coupled to a main I/O line pair MIOT/B via a transfer gate 15 that functions as a switch. The memory cell array 11 is divided into m+1 memory banks including memory banks BANK0 to BANKm.

A plurality of external terminals included in the semiconductor device 10 include a command address terminal 21, a clock terminal 22, a data terminal 23, and power terminals 24 and 25. The data terminal 23 is coupled to an I/O circuit 16.

A command address signal CA is supplied to the command address terminal 21. A signal related to an address in the command address signal CA supplied to the command address terminal 21 is transferred to an address decoder 32 via a command address input circuit 31, and a signal related to a command is transferred to a command decoder 33 via the command address input circuit 31. The address decoder 32 decodes the address signal to generate a row address XADD and a column address YADD. The row address XADD is supplied to the row decoder 12 and the column address YADD is supplied to the column decoder 13. A clock enable signal CKE in the command address signal CA is supplied to an internal clock generator 35.

Complementary external clock signals CK and /CK are supplied to the clock terminal 22. The complementary external clock signals CK and /CK are input to a clock input circuit 34. The clock input circuit 34 generates an internal clock signal ICLK based on the complementary external clock signals CK and /CK. The internal clock signal ICLK is supplied to at least the command decoder 33 and the internal clock generator 35. The internal clock generator 35 is activated, for example, by the clock enable signal CKE and generates an internal clock signal LCLK based on the internal clock signal ICLK. The internal clock signal LCLK is supplied to the I/O circuit 16. The internal clock signal LCKL is used as a timing signal that defines a timing when read data DQ is to be output from the data terminal 23 in a read operation. In a write operation, write data is input from outside to the data terminal 23. A data mask signal DM may be input from outside to the data terminal 23 in the write operation.

Power potentials VDD2 and VSS are supplied to the power terminal 24. These power potentials VDD2 and VSS are supplied to a voltage generator 36. The voltage generator 36 generates various internal potentials VPP, VOD, VARY, VPERI, and the like based on the power potential VDD2 and VSS. The internal potential VPP is mainly used in the row decoder 12, the internal potentials VOD and VARY are mainly used in the sense amplifiers 14 included in the memory cell array 11, and the internal potential VPERI is used in other many circuit blocks.

Power potentials VDDO and VSSQ are supplied from the power terminal 25 to the I/O circuit 16. Although the power potentials VDDQ and VSSQ can be same as the power potentials VDD2 and VSS supplied to the power terminal 24, respectively, dedicated power potentials VDDO and VSSQ are allocated to the I/O circuit 16 to prevent power-supply noise that occurs in the I/O circuit 16 from propagating to other circuit blocks.

The command decoder 33 activates an active signal ACT when an active command is issued. The active signal ACT is supplied to the row decoder 12. When a read command or a write command is issued from outside following the active command, the command decoder 33 activates a column selection sig al CYE. The column selection signal CYE is supplied to the column decoder 13 and a corresponding one of the sense amplifiers 14 is activated in response thereto.

Accordingly, read data is read from the memory cell array 11 in the read operation. The read data having been read from the memory cell array 11 is transferred to the I/O circuit 16 via a read/write amplifier 17 and a FIFO (First-In First-Out) circuit 18 and is output from the data terminal 23 to outside. In the write operation, write data having been input from outside via the data terminal 23 is written into the memory cell array 11 via the I/O circuit 16, the FIFO circuit 18, and the read/write amplifier 17.

The command decoder 33 activates a mode register set signal MRS when a mode register set command is issued. The mode register set signal MRS is supplied to a mode register 37. When the mode register set signal MRS is activated, various control parameters stored in the mode register 37 are overwritten.

Figure 2:
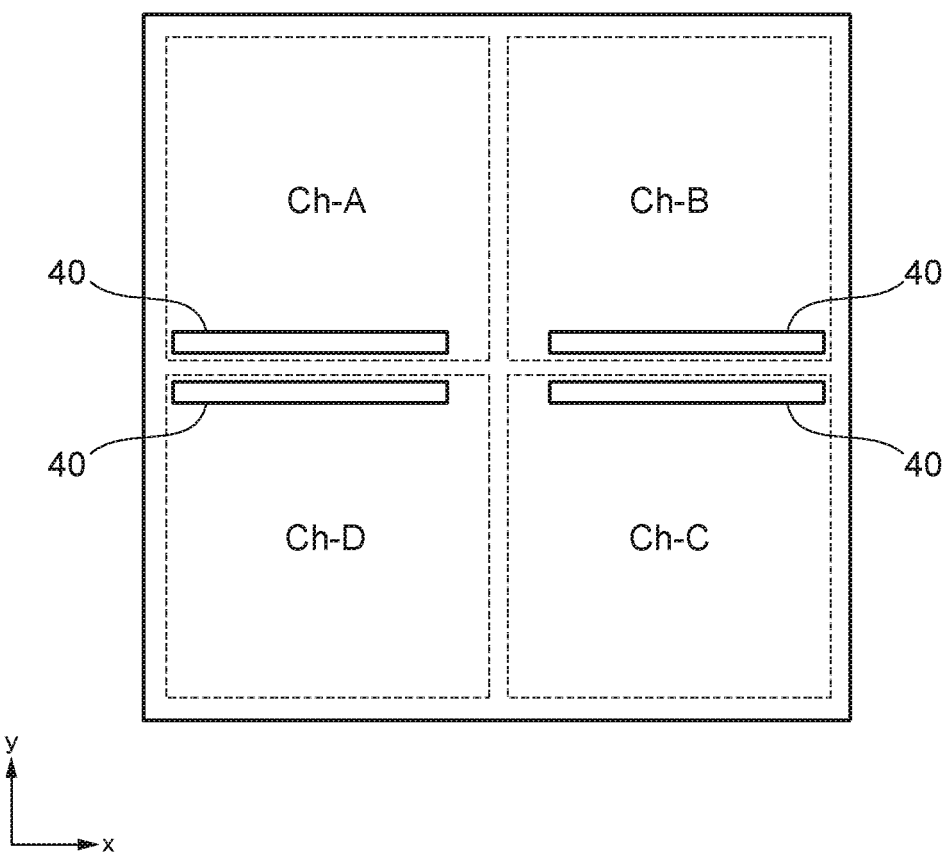
FIG. 2 is a schematic plan view of the semiconductor device shown in FIG. 1.

The semiconductor device 10 according to the present embodiment may be divided into four channels Ch-A to Ch-1) as shown in FIG. 2 being a top view. The channels Ch-A to Ch-D are capable of operating independently of each other. Therefore, in this case, the command address terminal 21, the clock terminal 22, the data terminal 23, the power terminals 24 and 25, and the like shown in FIG. 1 are allocated to each of the channels. As an example, the number of the data terminals 23, that is, the number of I/O bits per channel is 128 bits. A plurality of terminal electrodes allocated to each of the channels Ch-A to Ch-D are arranged in a terminal area 40 corresponding to the associated channel.

Figure 3:
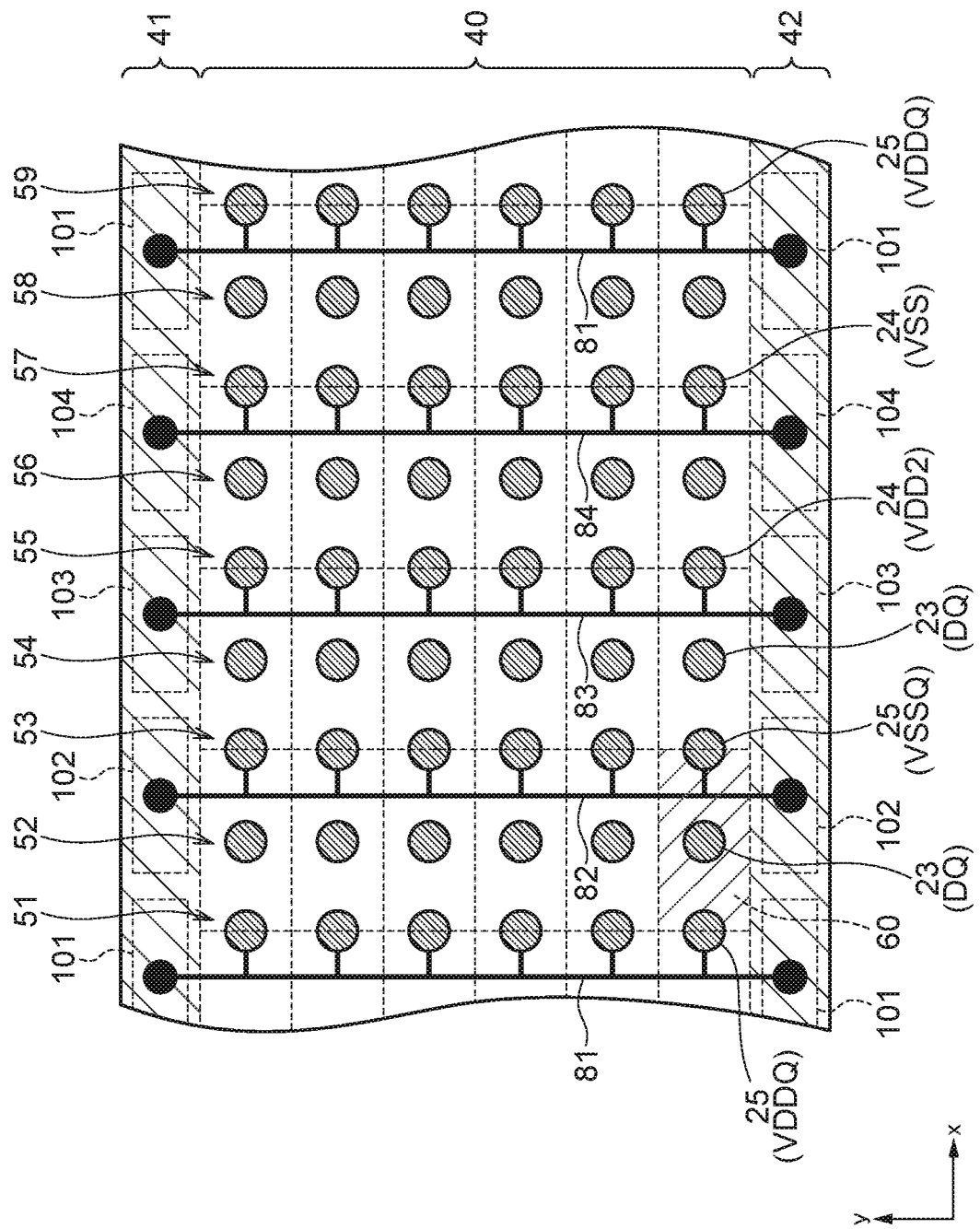
FIG. 3 is a partially enlarged view of terminal areas shown in FIG. 2.

FIG. 3 is a partially enlarged view of the terminal areas 40. As shown in FIG. 3, a plurality of terminal electrodes are laid out in a matrix in each of the terminal areas 40. Although the data terminals 23 and the power terminals 24 and 25 are shown in FIG. 3, the command address terminals 21 and the clock terminals 22 are also arranged in the terminal area 40. Further, data I/O circuits 60 are arranged in the terminal area 40 to overlap with a plurality of the terminal electrodes 23 to 25. The data I/O circuits 60 include the I/O circuit 16 and the FIFO circuit 18 shown in FIG. 1 and are coupled to the associated data terminals 23, respectively. FIG. 3 shows terminal sequences 51 to 59 each including six terminal electrodes arrayed in a y direction. The terminal sequences 51 to 59 are arrayed in an x direction. As an example, the terminal sequences 52, 54, 56, and 58 include data terminals (or data mask terminals) 23 that input/output data DQ, the terminal sequences 51 and 59 include the power terminals 25 to which the power potential VDDQ is supplied, the terminal sequence 53 include the power terminals 25 to which the power potential VSSQ is supplied, the terminal sequence 55 includes the power terminals 24 to which the power potential VDD2 is supplied, and the terminal sequence 57 includes the power terminals 24 to which the power potential VSS is supplied.

As shown in FIG. 3, ESD areas 41 and 42 are arranged on both sides of each of the terminal areas 40 in the y direction. ESD protection circuits for power are arranged in the ESD areas 41 and 42. The ESD protection circuits for power include ESD protection circuits 101 for VDDQ, ESD protection circuits 102 for VSSQ, ESD protection circuits 103 for VDD2, and ESD protection circuits 104 for VSS. The power ESD protection circuits 101 included in the ESD areas 41 and 42 are coupled to each other via power lines 81, respectively, the power ESD protection circuits 102 included in the ESD areas 41 and 42 are coupled to each other via a power line 82, the power ESD protection circuits 103 included in the ESD areas 41 and 42 are coupled to each other via a power line 83, and the power ESD protection circuits 104 included in the ESD areas 41 and 42 are coupled to each other via a power line 84. The power lines 81 to 84 all extend in the y direction and are coupled to the associated terminal sequences 51, 53, 55, 57, and 59, respectively. Accordingly, the power terminals 24 and 25 are coupled to the associated power ESD protection circuits 101 to 104 via the corresponding power lines 81 to 84.

Figure 4:
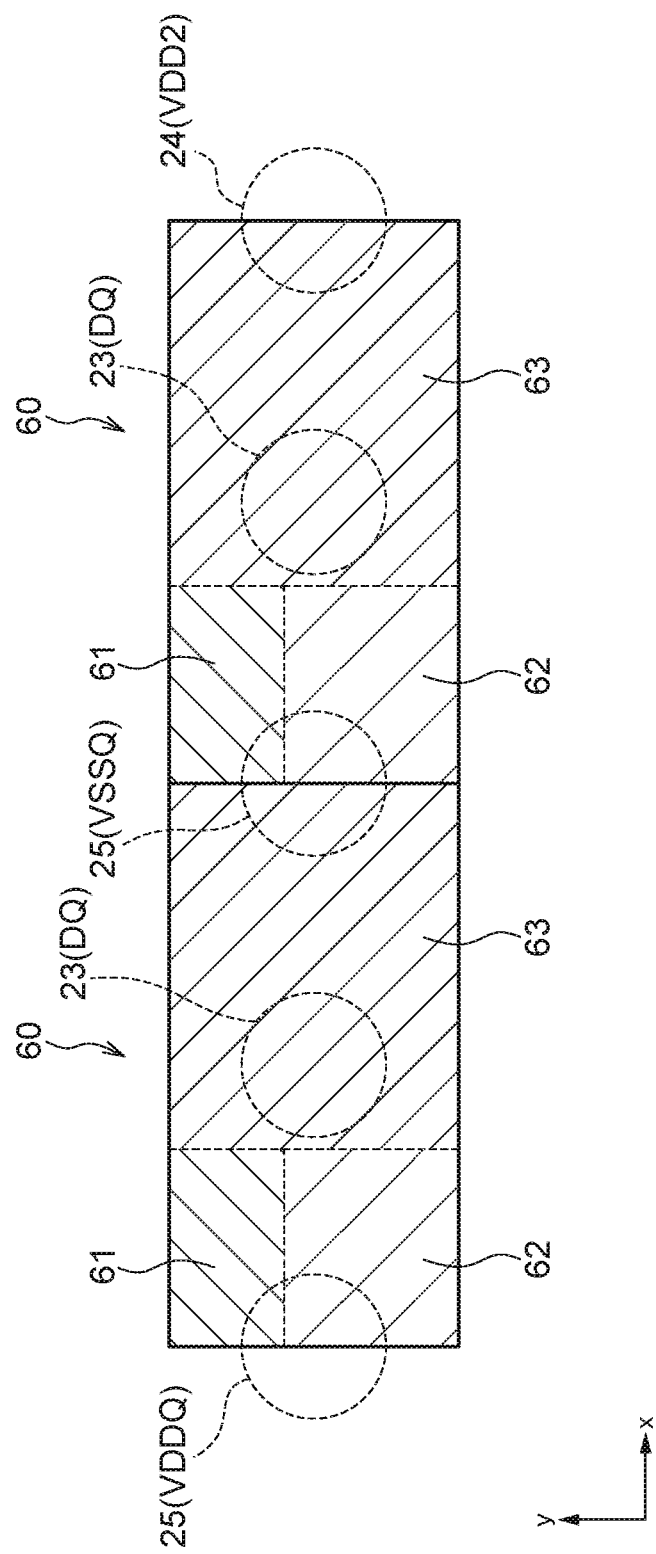
FIG. 4 is a schematic diagram showing a positional relation between data I/O circuits and data terminals and power terminals.

FIG. 4 is a schematic diagram showing a planar positional relation between the data I/O circuits 60 and the data terminals 23 and the power terminals 24 and 25. As shown in FIG. 4, the data terminals 23 are arranged to overlap with the associated data I/O circuits 60, respectively. Each of the data I/O circuits 60 includes an output circuit area 61, an input circuit area 62, and a conversion circuit area 63. The power terminal 24 or 25 is arranged in a boundary portion between ones of the data I/O circuits 60 adjacent in the x direction. Therefore, one power terminal 24 or 25 is arranged to overlap with two data I/O circuits 60.

Figure 5:
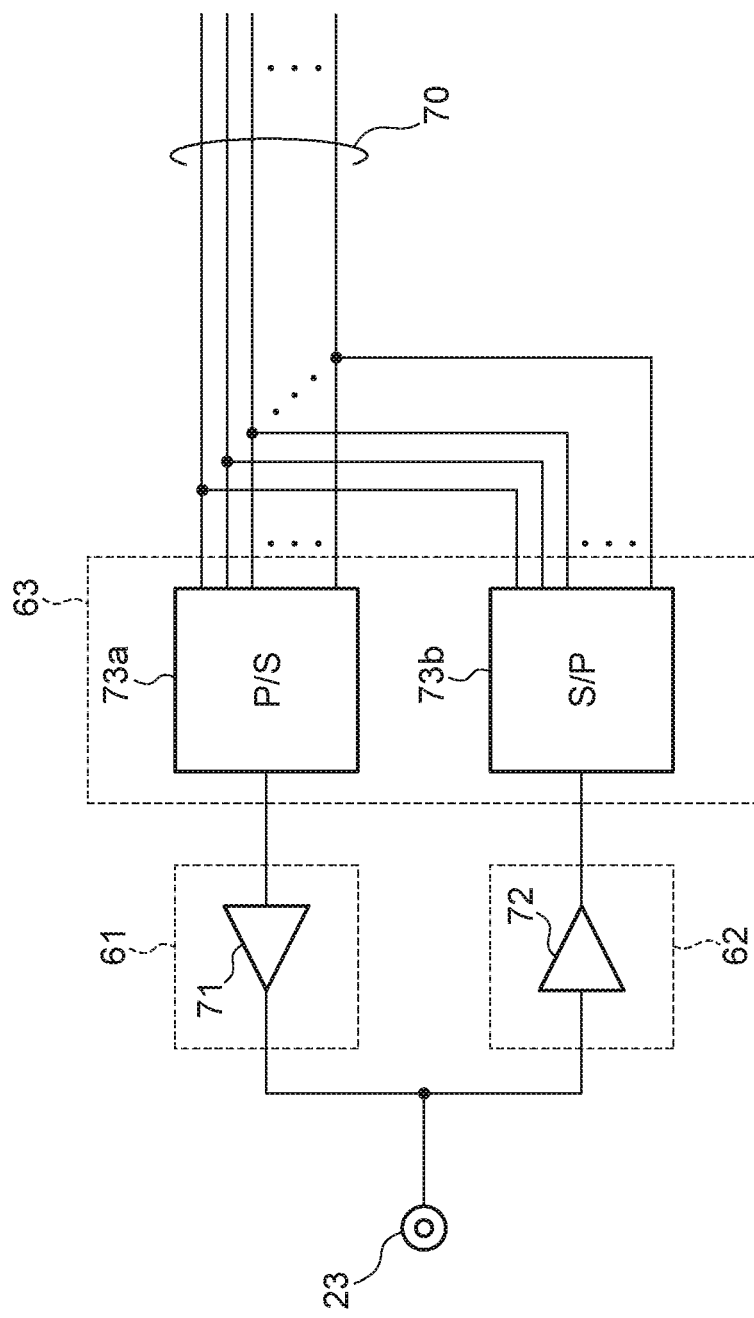
FIG. 5 is a circuit diagram of the data I/O circuits shown in FIG. 4.

FIG. 5 is a circuit diagram of the data I/O circuits 60. As shown in FIG. 5, an output buffer 71 is placed in the output circuit area 61, an input buffer 72 is placed in the input circuit area 62, and a parallel-serial conversion circuit 73a and a serial-parallel conversion circuit 73b are placed in the conversion circuit area 63. The output buffer 71 and the input buffer 72 correspond to the I/O circuit 16 shown in FIG. 1, and the parallel-serial conversion circuit 73a and the serial-parallel conversion circuit 73b correspond to a portion of the FIFO circuit 18 shown in FIG. 1. The parallel-serial conversion circuit 73a converts parallel read data DQ supplied from the memory cell array 11 via a read/write bus 70 into serial data, and supplies the serial data to the output buffer 71. The serial-parallel conversion circuit 73b converts serial write data output from the input buffer 72 into parallel data, and supplies the parallel data to the read/write bus 70.

Figure 6:
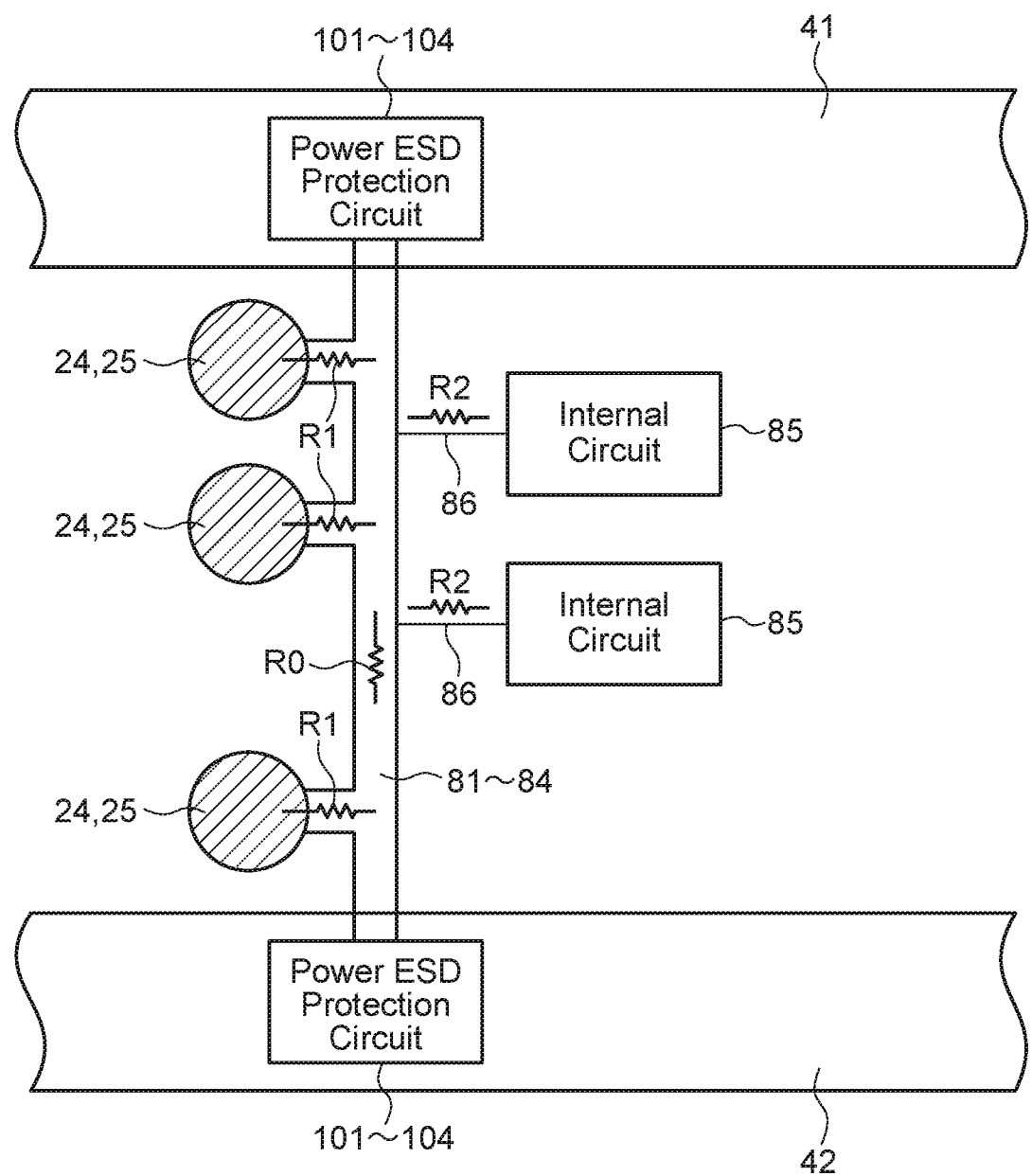
FIG. 6 is a schematic diagram of power lines shown in FIG. 3.

As the power lines 81 to 84, iRDL (inline redistribution layer) lines that are located in a low-resistance wiring layer, for example, a topmost layer are used. Therefore, as shown in FIG. 6, a resistance value R0 of a portion coupling the ESD area 41 and the ESD area 42 or a resistance value R1 of a portion coupled to the power terminal 24 or 25 is significantly lower than a resistance value R2 of different power lines 86 each coupling the power lines 81 to 84 to an internal circuit 85. The different power lines 86 are lines located in a layer lower than the power lines 81 to 84. The sectional area of each of the power lines 81 to 84 is significantly larger than the sectional area of the power lines 86 and accordingly the resistance value per unit length of each of the power lines 81 to 84 is equal to or less than one tenth of the resistance value per unit length of each of the power lines 86. The internal circuit 85 may be the data I/O circuit 60.

Because the power ESD protection circuits 101 to 104 arranged in each of the ESD areas 41 and the power ESD protection circuits 101 to 104 arranged in the corresponding ESD area 42 are coupled with the low-resistance power lines 81 to 84, sufficient ESD protecting characteristics can be obtained even when the power ESD protection circuits 101 to 104 are arranged in the ESD areas 41 and 42 located outside the associated terminal area 40 without the power ESD protection circuits 101 to 104 being arranged in the associated terminal area 40 where the power terminals 24 and 25 are arrayed. Because the power ESD protection circuits 101 to 104 do not need to be arranged in the terminal areas 40, the data I/O circuits 60 can be arranged in the terminal areas 40 at a high density Particularly in the example shown in FIG. 3, the array pitch of the data terminals 23 in the x direction and the width of each of the data I/O circuits 60 in the x direction are substantially same and the array pitch of the data terminals 23 in the y direction and the width of each of the data I/O circuits 60 in the y direction 60 are substantially same. Therefore, the distances between the data terminals 23 and associated ones of the data I/O circuits 60 can be uniformized. The array pitch of the power terminals 24 and 25 in the x direction is also substantially same as the width of each of the data I/O circuits 60 in the x direction and the array pitch of the power terminals 24 and 25 in the y direction is also substantially same as the width of each of the data I/O circuits 60 in the y direction.

Figure 7:
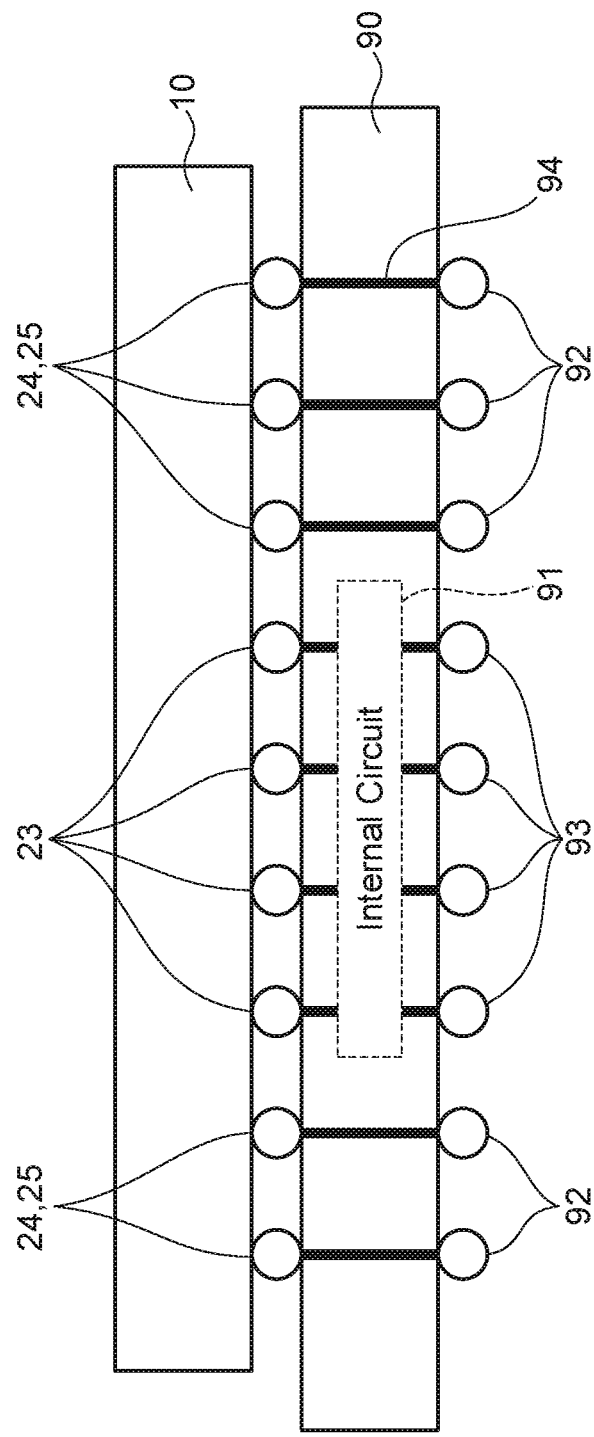
FIG. 7 is a schematic diagram showing a state where the semiconductor device according to an embodiment of the present disclosure is stacked on a controller chip.
Figure 8:
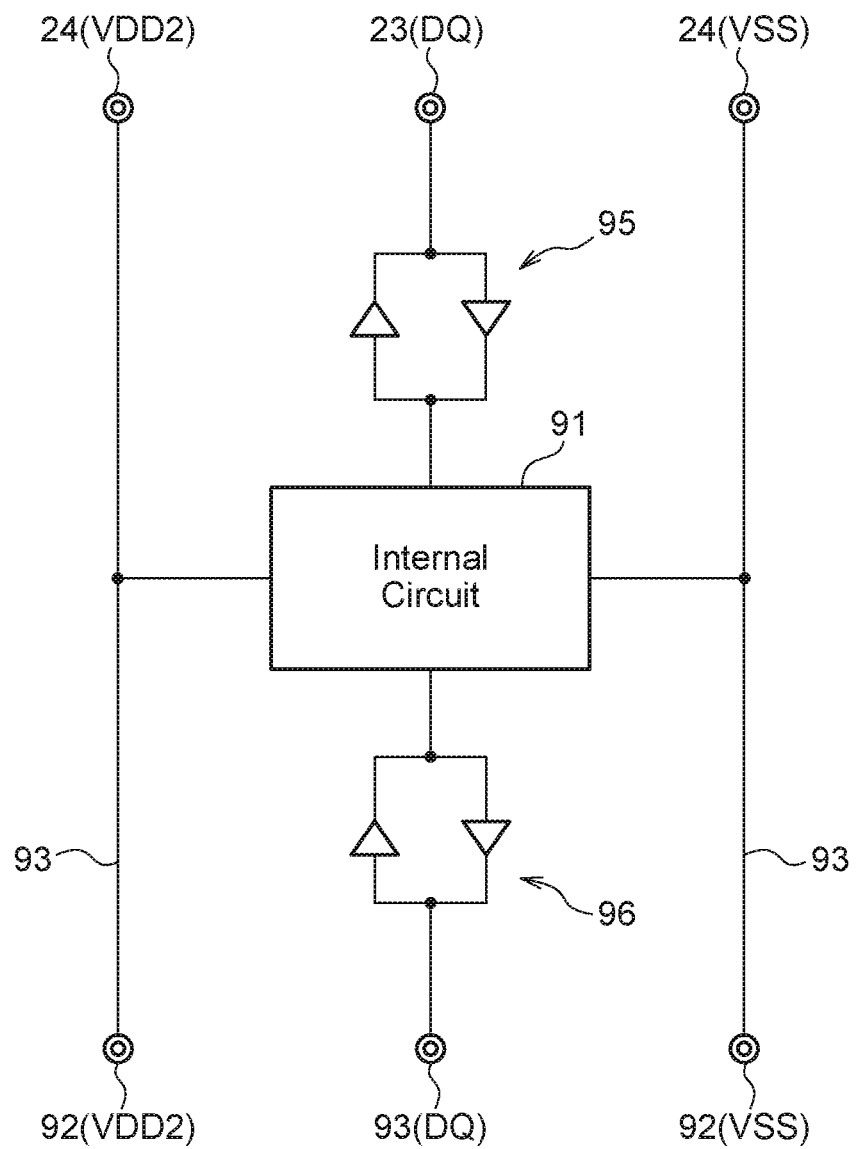
FIG. 8 is a circuit diagram for explaining a connection relation between the semiconductor device according to an embodiment of the present disclosure and a controller chip.

As shown in FIG. 7, the semiconductor device 10 according to an embodiment of the present embodiment can be stacked on a controller chip 90. The controller chip 90 includes an internal circuit 91 and includes power terminals 92 and data terminals 93 to be coupled to a package substrate or a motherboard. The power terminals 92 are directly coupled to the power terminals 24 or 25 of the semiconductor substrate 10 via through-silicon vias (TSVs) 94 provided through the controller chip 90. In contrast thereto, the data terminals 93 are coupled to the internal circuit 91 via an input/output buffer 96 shown in FIG. 8 without being directly coupled to the data terminals 23. The internal circuit 91 is coupled to the data terminals 23 of the semiconductor device 10 via an input/output buffer 95. Accordingly, when ESD is applied to the power terminals 92 of the controller chip 90, the ESD is applied also to the power terminals 24 and 25 of the semiconductor device 10. However, the ESD applied to the power terminals 24 and 25 of the semiconductor device 10 is absorbed by the power ESD protection circuits 101 to 104 arranged in the ESD areas 41 and 42. On the other hand, the data terminals 93 of the controller chip 90 are not directly coupled to the data terminals 23 of the semiconductor device 10. Therefore, even when ESD is applied to the data terminals 93 of the controller chip 90, the ESD is not applied to the data terminals 23 of the semiconductor device 10. It is accordingly unnecessary to add an ESD protection circuit for data to each of the data I/O circuits 60, which enables the occupation area of the data I/O circuits 60 to be reduced.

Figure 9:
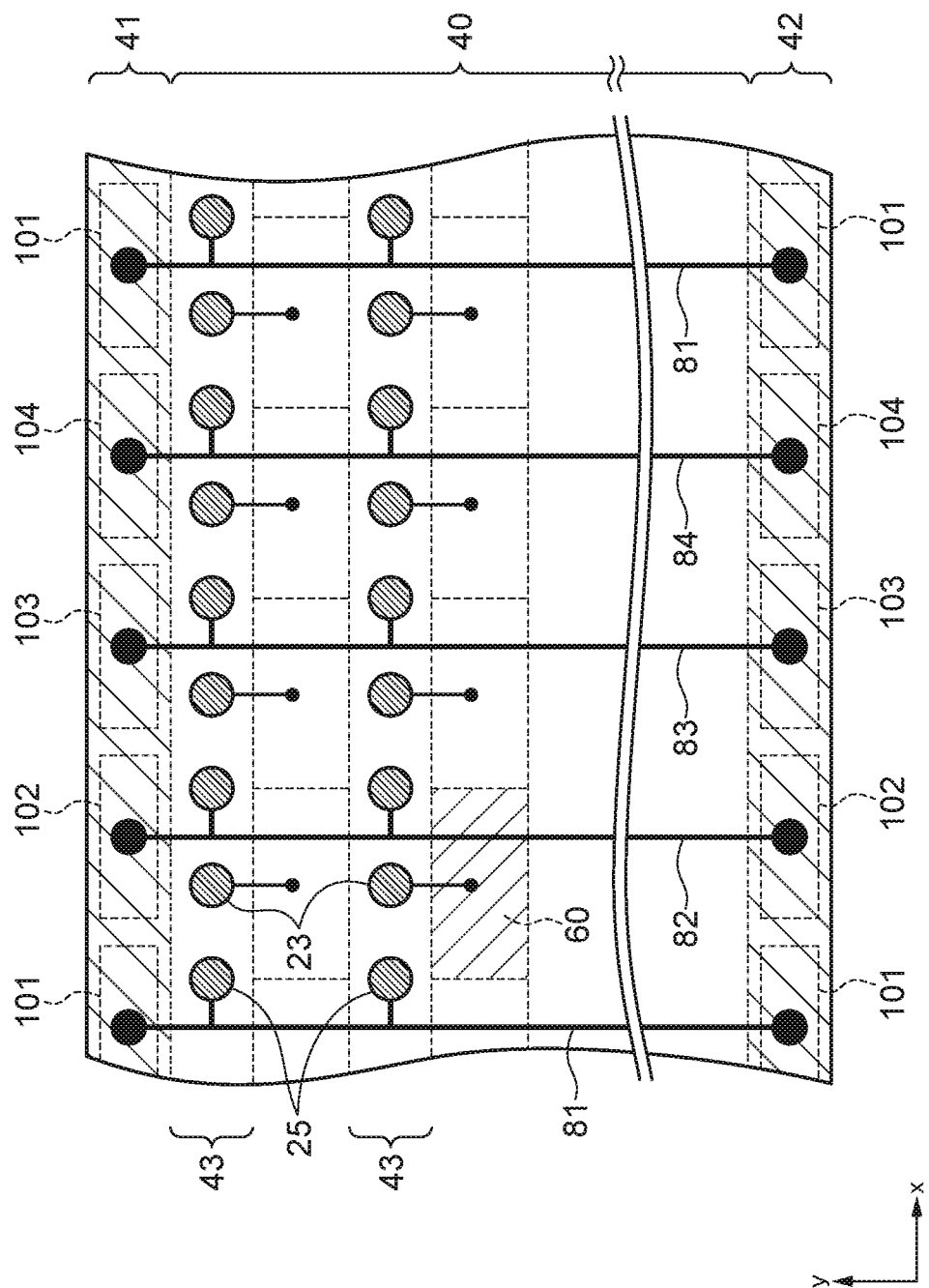
FIG. 9 is a layout diagram of terminal areas according to a modification according to an embodiment of the present disclosure.

FIG. 9 is a layout diagram of the terminal areas 40 according to a modification according to an embodiment of the present disclosure. In the example shown in FIG. 9, a plurality of clearance areas 43 where the data I/O circuits 60 are not arranged are provided in each of the terminal areas 40. The clearance areas 43 extend in the x direction and the data terminals 23 and the power terminals 24 and 25 are arrayed in the x direction in each of the clearance areas 43. With this arrangement of the data terminals 23 and the power terminals 24 and 25 in the clearance areas 43, TSVs can be provided in the terminal areas 40 to overlap with the data terminals 23 and the power terminals 24 and 25.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form varying mode of the disclosed invention. Thus, it is intended that the scope of at least soave of the present invention herein disclosed should not be limited by the particular disclosed embodiments described above.

The invention claimed is:

1. An apparatus comprising:
   a first power ESD protection circuit arranged in a first circuit area;
   a plurality of data I/O circuits arranged in a second circuit area adjacent to the first circuit area in a first direction;
   a plurality of data I/O terminals arranged in the second circuit area, each of the plurality of data I/O terminals being coupled to an associated one of the plurality of data I/O circuits;
   a plurality of first power terminals arranged in the second circuit area; and
   a first power line extending in the first direction, the first power line coupling the plurality of first power terminals to the first power ESD protection circuit.

2. The apparatus of claim 1, further comprising a second power ESD protection circuit arranged in a third circuit area, wherein the second circuit area is arranged between the first and third circuit areas in the first direction, and wherein the first power line further couples the plurality of first power terminals to the second power ESD protection circuit.

3. The apparatus of claim 2, further comprising:
   a plurality of second power terminals arranged in the second circuit area; and
   a second power line extending in the first direction, the second power line coupling the plurality of second power terminals to the first and second power ESD protection circuits.

4. The apparatus of claim 3, wherein the plurality of data I/O terminals are located between the plurality of first power terminals and the plurality of second power terminals in a second direction substantially perpendicular to the first direction.

5. The apparatus of claim 4, wherein an array pitch of the first and second power terminals of the first and second plurality of power terminals in the second direction is substantially the same as a width of each of the plurality of data I/O circuits in the second direction.

6. The apparatus of claim 1, further comprising a third power line coupling the first power line to an internal circuit.

7. The apparatus of claim 6, wherein the first power line is lower in resistance than the third power line.

8. The apparatus of claim 1, wherein each of the plurality of data I/O terminals overlaps with the associated one of the plurality of data I/O circuits.

9. The apparatus of claim 8, wherein each of the plurality of first power terminals overlaps with two of the data I/O circuits of the plurality of data I/O circuits.

10. The apparatus of claim 1, wherein the data I/O terminals of the plurality of data I/O terminals and first power terminals of the plurality of first power terminals are arranged so as not to overlap with the data I/O circuits.

11. The apparatus of claim 1, wherein each of the plurality of data I/O circuits includes:
   a parallel-serial conversion circuit;
   a serial-parallel conversion circuit;
   a data input buffer coupled between an associated one of the plurality of data I/O terminals and the parallel-serial conversion circuit; and
   a data output buffer coupled between an associated one of the plurality of data I/O terminals and the serial-parallel conversion circuit.

12. An apparatus comprising:
a plurality of external terminals including a plurality of data I/O terminals, a plurality of first power terminals and a plurality of second power terminals;
a plurality of data I/O circuits each coupled to a corresponding one of the plurality of data I/O terminals, a corresponding at least one of the plurality of first power terminals and a corresponding at least one of the plurality of second power terminals; and
first and second ESD protection circuits each coupled to at least one of the plurality of first power terminals and at least one of the plurality of second power terminals;
wherein the plurality of external terminals and the plurality of data I/O circuits are arranged in a first circuit area; and
wherein the first ESD protection circuit and the second ESD protection circuit are arranged in a second circuit area and a third circuit area, respectively, and the first circuit area is between the second circuit area and the third circuit area.

13. The apparatus of claim 12,
wherein the first ESD protection circuit includes first and second circuit blocks,
wherein the second ESD protection circuit includes third and fourth circuit blocks,
wherein the plurality of first power terminals are coupled to the first and third circuit blocks, and
wherein the plurality of second power terminals are coupled to the second and fourth circuit blocks.

14. The apparatus of claim 13, further comprising:
a first conductive line coupling the plurality of first power terminals to the first and third circuit blocks in common; and
a second conductive line coupling the plurality of second power terminals to the second and fourth circuit blocks in common.

15. The apparatus of claim 14,
wherein the first circuit area is arranged between the second circuit area and the third circuit area in a first direction,
wherein the plurality of first power terminals are arranged in the first direction,
wherein the plurality of second power terminals are arranged in the first direction, and
wherein each of the first and second conductive lines extends in the first direction.

16. The apparatus of claim 15, wherein one of the plurality of data I/O terminals, one of the plurality of first power terminals, and one of the plurality of second power terminals are arranged in a second direction substantially perpendicular to the first direction.

17. The apparatus of claim 16, wherein one of the plurality of data I/O terminals is arranged between one of the plurality of first power terminals and one of the plurality of second power terminals.

18. An apparatus comprising:
a plurality of power terminals and a plurality of data I/O terminals alternately arranged in a first direction;
a plurality of data I/O circuits arranged in the first direction, each of the plurality of data I/O terminals being coupled to an associated one of the plurality of data I/O circuits;
first and second circuit areas each including a plurality of power ESD protection circuits, the first and second circuit areas being arranged so as to sandwich the plurality of data I/O circuits in a second direction different from the first direction; and
a plurality of first power lines extending in the second direction and the plurality of first power lines coupled to the plurality of power ESD protection circuits in the first and second circuit areas, each of the plurality of first power lines being coupled to an associated one of the plurality of power terminals.

19. The apparatus of claim 18, wherein the plurality of power terminals and the plurality of data I/O terminals overlap with the plurality of data I/O circuits.

20. The apparatus of claim 18, further comprising a plurality of second power lines coupling each of the plurality of first power lines to internal circuits,
wherein each of the plurality of first power lines is lower in resistance than each of the plurality of second power lines.

* * * * *